(12) United States Patent
Kern

(10) Patent No.: US 6,583,658 B1
(45) Date of Patent: Jun. 24, 2003

(54) BALANCED CIRCUIT ARRANGEMENT

(75) Inventor: Otmar Kern, Berlin (DE)

(73) Assignee: Georg Neumann, Berlin (DE)

(*) Notice: Subject to any disclaimer, the term of this patent is extended or adjusted under 35 U.S.C. 154(b) by 0 days.

(21) Appl. No.: 10/203,160
(22) PCT Filed: Feb. 11, 2000
(86) PCT No.: PCT/EP00/01134
§ 371 (c)(1), (2), (4) Date: Aug. 6, 2002
(87) PCT Pub. No.: WO01/59928
PCT Pub. Date: Aug. 16, 2001

(51) Int. Cl.[7] .............................................. H03H 11/16
(52) U.S. Cl. ....................... 327/258; 327/245; 327/246; 327/363
(58) Field of Search ................................. 327/239, 243, 327/245, 246, 247, 256–259, 362, 363, 560–563, 77; 341/161

(56) References Cited

U.S. PATENT DOCUMENTS

| | | | |
|---|---|---|---|
| 4,764,752 A | | 8/1988 | Ormond |
| 5,159,340 A | * | 10/1992 | Smith .......................... 341/132 |
| 5,294,783 A | | 3/1994 | Hammond et al. |
| 5,321,402 A | * | 6/1994 | Matsuzawa et al. ........ 341/161 |
| 5,592,167 A | | 1/1997 | Caruso et al. |
| 5,872,482 A | | 2/1999 | Krauss |
| 6,097,245 A | * | 8/2000 | Dobbelaere et al. ........ 327/560 |
| 6,507,223 B2 | * | 1/2003 | Felder ......................... 327/77 |

FOREIGN PATENT DOCUMENTS

| | | |
|---|---|---|
| DE | 2629172 A | 1/1978 |
| DE | 252716 A | 12/1987 |
| EP | 0375195 A | 6/1990 |
| EP | 0415080 A | 3/1991 |
| EP | 0712002 A | 5/1996 |
| FR | 2778513 A | 11/1999 |

\* cited by examiner

*Primary Examiner*—Toan Tran
(74) *Attorney, Agent, or Firm*—Venable LLP; Robert Kinberg

(57) ABSTRACT

The invention relates to a balanced circuit arrangement for converting an asymmetric analogous input signal (S1) into a symmetrical output signal (S2, S3). A first amplifier (2) is provided, whereby the non-inverting input thereof is connected to the analogous input signal (S1) and the output signal (S2) thereof is fed back to the inverting input thereof in a negative feedback. Moreover, a second amplifier (3) is provided, whereby the non-inverting input thereof is connected to ground, the inverting input thereof is connected to the output signal (S2) of the first amplifier (2) by means of a series resistor (R2) and the output signal (S3) thereof is fed back to the inverting input thereof in a negative feedback and by means of a negative feedback resistor (R1). The negative feedback resistor (R1) and the series resistor (R2) are provided with the same resistance value. The aim of the invention is to process higher maximum levels of the source signal and to suppress noises of the second amplifier. The output signal (S3) of the second amplifier (3) is fed back to the base point of the signal source (1) for the analogous input signal (S1) in a negative feedback.

3 Claims, 1 Drawing Sheet

BALANCED CIRCUIT ARRANGEMENT

The invention relates to a balanced circuit arrangement as defined in the preamble to patent claim 1. A circuit arrangement of this type is generally known.

High-resolution delta-sigma converters are normally used to convert an analog signal, for example the output signal for a capacitor microphone capsule, to a digital signal. For technological reasons, converters of this type operate with a voltage of +5 volt and have symmetric analog inputs. The defined permissible analog input levels for a full control in this case are maximum +/−1.25 volt opposite phase for each input connection, which corresponds to a differential signal of +/−2.5 volt. An asymmetric analog input signal, for example as provided by a capacitor microphone capsule behind the impendance converter, therefore must always be inverted as well. For this, FIG. 1 shows a balanced circuit arrangement according to prior art.

Figure 1:
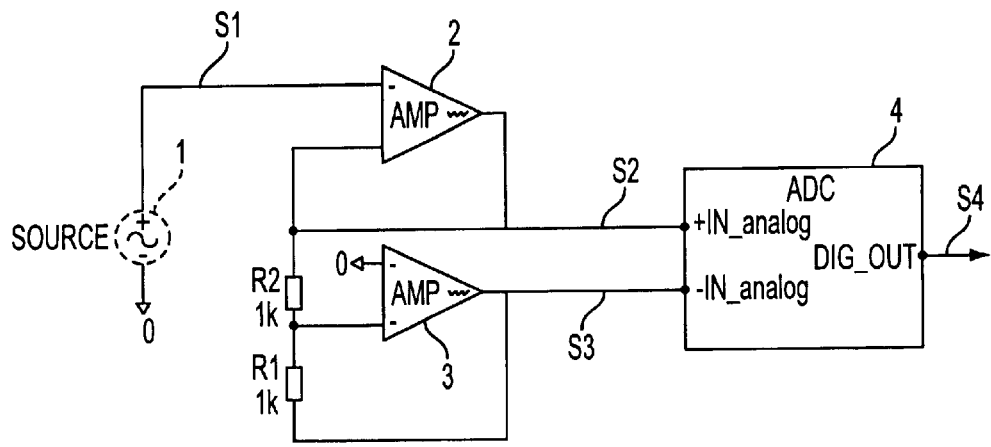

In FIG. 1, the output signal S1 from a signal source 1, for example a microphone capsule, is connected to the non-inverting input of a first amplifier 2. So that the first amplifier 2 has an amplification of V=+1, its output signal S2 is fed back in the form of a negative feedback to the inverting input of amplifier 2. The signal S2 is also supplied to the non-inverting input of an analog/digital converter 4. In addition, the output signal S2 from the first amplifier 2 is connected via a series resistor (R2) to the inverting input of a second amplifier 3. The non-inverting input of the second amplifier 3 is connected to ground or to a reference potential. The output signal S3 from the second amplifier 3 is fed to the inverting input of the analog-digital converter 4 and is also fed back to the inverting input of the second amplifier 3 via a resistor R1, in the form of a negative feedback. The negative feedback resistor R1 has the same value as the series resistor R2. As a result of these connections, the second amplifier 3 has an amplification degree of V=−1 for its input signal S2. The output rate of output signal S3 from the second amplifier 3 is equal to that of the output signal S2 from the first amplifier 2 and is inverted as compared to the signal S2. The digital signal S4 generated at the output of the analog/digital converter 4 represents the differential signal between the input signals S2 and S3 of the converter 4 and thus corresponds to double the value of signal S2.

The balanced circuit arrangement according to FIG. 1 has the following disadvantages:

As referred to the symmetric input of the analog/digital converter 4, the signal S1 from the signal source 1 is amplified by the factor 2, so that only a maximum source signal level of +/−1.25 volt can be processed. However, the peak amplitudes processed in modem analog capacitor microphone capsules are considerably higher.

The second amplifier 3 adds a disproportionate share of its own noise to the noise from the first amplifier 2. The reason for this is that the noise developing in the second amplifier 3 always appears as if it were fed into its inverting input. Thus, while the amplification degree of the second amplifier 3 for the useful signal is adjusted with the aid of resistors R1, R2 to V=−1, the noise from the second amplifier 3 is amplified in accordance with the formula (R1+R2)/R2=2, in the same way as for a signal fed into its non-inverting input.

Accordingly, it is the object of the invention to create a balanced circuit arrangement that can process higher maximum levels of the source signal and generates less noise.

This object is solved according to the invention with the characterizing features in claim 1.

Advantageous embodiments and modifications of the balanced circuit arrangement according to claim 1 follow from the dependent claims.

Figure 2:
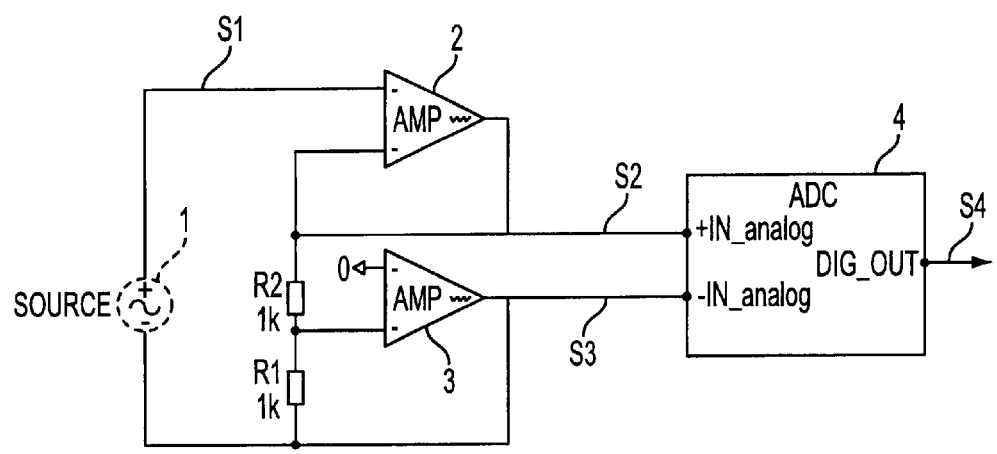
Figure 3:
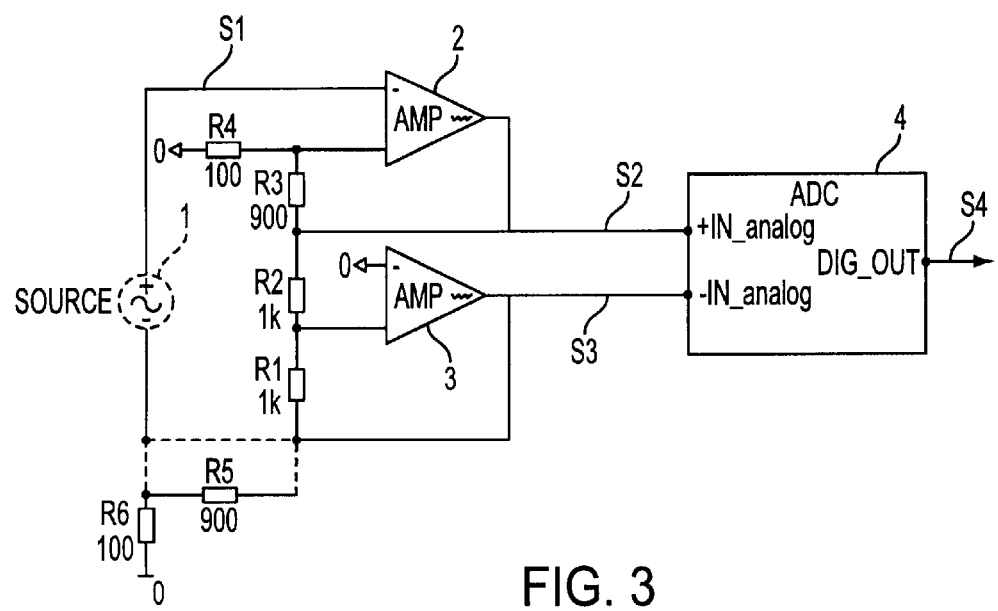

The invention is explained in further detail with the aid of exemplary embodiments shown in the drawings, which show in:

FIG. 2 An electric circuit diagram of a first embodiment of a balanced circuit arrangement according to the invention; and FIG. 3 An electric circuit diagram of another embodiment of a balanced circuit arrangement according to the invention.

balanced circuit arrangement shown in FIG. 2 in principle has the same circuit configuration as the one shown in FIG. 1. In contrast to FIG. 1, however, the output signal S3 from the amplifier 3 not only is fed back with a negative feedback to the inverting input of the second amplifier 3, but is simultaneously also fed to the base point of signal source 1. This has the effect of a negative feedback, which triggers the base point of signal source 1 with the opposite sign, as compared to the output signal S1. The addition of the two signal voltages S1 and S3 with the correct sign automatically results in the voltage amount that is generated by the signal source 1 between its two terminals.

As a result of the negative feedback of signal 3 to the base point of the signal source 1, the signal voltage S1—as referred to the reference potential or ground—is reduced by the amount of the signal voltage S3, in accordance with:

$$-1/2 \times V_{ges},$$

wherein $V_{ges}$ represents the total amplification of the closed control circuit for the circuit arrangement between output and base point of signal source 1. The total amplification $V_{ges}$ in the case of the circuit arrangement according to FIG. 1 has the value $V_{ges}=-1$. The signal voltage S1 is thus reduced to half the value of that in the circuit arrangement according to FIG. 1. In this way, the signal voltage source 1 also carries a symmetrical signal at both of its terminal connections with the same value as the differential signal between the outputs for the amplifiers 2 and 3 or the symmetrical input of the analog/digital converter 4. The degree of amplification between the signal source 1 and the input for the analog/digital converter 4 in that case is only V=1, so that signal amplitudes for S1 of up to +/−2.5 volt can be transmitted.

As an additional and essential advantage, the undesirable internal noise from the amplifier 3 is eliminated completely with respect to the analog/digital converter 4 input, which reacts to differential signals. To create this effect, the noise developing at the output of amplifier 3 travels without reduction and via the base point of the signal source 1 to the input or output of the first amplifier 2 and is present thereon at the same level and with the same phase position than at the ouput of the second amplifier 3. Since the output of the first amplifier 2 simultaneously forms the base point of the negative feedback voltage divider, formed with resistors R1 and R2, non-inverted signal components from the second amplifier 3, meaning its internal noise, are no longer divided in the direction of its inverting input. As a result, this noise is no longer amplified by the factor of 2, as is the case with the circuit arrangement according to FIG. 1, but is amplified by V=1. Since the same noise level is present with the same phase position at the output of the second amplifier 3 as well as the output of the first amplifier 2, it is no longer picked up by the analog/digital converter 4 that reacts only to signals in opposite phase, but is suppressed. This working mechanism is maintained, even if for specific operating cases a signal amplification between the signal source 1 and the analog/digital converter 4 is desired. An amplification of this type is adjusted through voltage division in the negative feedback path of amplifier 2, as shown with the example in FIG. 3. The resistors R3 and R4 are used for this in FIG. 3. Owing to the effect of the closed control loop, the noise at the output of the second amplifier 3 is negatively amplified by the measure of the adjusted amplification of the first amplifier 2, meaning it is mostly suppressed, while it continues to be present unchanged at the output of the first amplifier 2 with the amplification degree V=1. The signal voltage S1 transmitted by the signal source 1 furthermore appears no longer symmetrical, relative to the reference potential or ground, but only as addition of the signal voltages S1 and S3, wherein the signal voltage S3 is higher than the signal voltage S1 by the amount of amplification of the first amplifier 2. Generally, this does not result in a disadvantage whereas the noise voltage from the second amplifier 3 is nearly cut in half at the input to the analog/digital converter 4, as compared to the conditions for the known circuit arrangement according to FIG. 1.

By inserting an additional voltage divider R5 and R6, which preferably has the same division ratio as the resistors R1 and R4, the signal S3 that is fed back to the base point of the signal source 1 can be weakened by the amount of amplification of the first amplifier 2. With respect to suppressing the noise signal and the symmetry of signal S1 from the voltage source 1, the same advantageous conditions result as are described with the aid of the exemplary embodiment according to FIG. 2.

What is claimed is:

1. A balanced circuit arrangement for converting an asymmetrical analog input signal (S1) to a symmetrical output signal (S2, S3), in particular for feeding it to an analog/digital converter (4) with symmetrical analog inputs, comprising a first amplifier (2), the non-inverting input of which is connected to the analog input signal (S1) and the output signal (S2) of which is fed back via a negative feedback to its inverting input;

a second amplifier (3), the non-inverting input of which is connected to ground, the inverting input of which is connected to the output signal (S2) of the first amplifier (2) via a series resistor (R2) and the output signal (S3) of which is fed back to its inverting input in a negative feedback and by means of a negative feedback resistor (R1), wherein the negative feedback resistor (R1) and the series resistor (R2) have the same resistance value, characterized in that the base point of the signal source (1) for the analog input signal (S1) is connected to the output of the second amplifier (3), such that the signal source (1) forms a component of a negative feedback loop, which consists of the first amplifier (2), the series resistor (R2), the second amplifier (3) and the signal source (1), wherein a balanced terminal signal is generated at the two connections for the signal source (1).

2. A balanced circuit arrangement according to claim 1, characterized in that the output signal (S2) from the first amplifier (2) is fed via a voltage divider (R3, R4) and in a negative feedback to its inverting input, wherein the tap for the voltage divider (R3, R4) is connected to the inverting input of the first amplifier (2).

3. A balanced circuit arrangement according to claim 1, characterized in that the output signal (S3) of the second amplifier (3) is fed with negative feedback and via a voltage divider (RS, F6) to the base point of the signal source (1) for the analog input signal (S1), wherein the tap for the voltage divider (RS, R6) is connected to the base point of the signal source (1).

* * * * *